United States Patent

Yagi

[15] 3,663,873

[45] May 16, 1972

[54] FIELD EFFECT TRANSISTOR

[72] Inventor: Hajime Yagi, Tokyo, Japan

[73] Assignee: Sony Corporation, Tokyo, Japan

[22] Filed: Jan. 27, 1969

[21] Appl. No.: 802,717

Related U.S. Application Data

[63] Continuation of Ser. No. 580,752, Sept. 20, 1966, abandoned.

[30] Foreign Application Priority Data

Oct. 8, 1965 Japan....................................40/61745

[52] U.S. Cl.........................317/235 R, 317/235 A, 148/175
[51] Int. Cl.........................................................H01l 11/14
[58] Field of Search..........................................317/235, 21

[56] References Cited

UNITED STATES PATENTS

| | | | |
|---|---|---|---|
| 2,967,985 | 1/1961 | Shockley et al. | 317/235 |
| 2,975,344 | 3/1961 | Wegener | 317/235 |
| 3,183,128 | 5/1965 | Leistiko et al. | 317/235 |
| 3,223,904 | 12/1965 | Warner et al. | 317/235 |
| 3,363,152 | 1/1968 | Lin | 317/235 |
| 3,453,504 | 7/1969 | Compton et al. | 317/235 |

*Primary Examiner*—Jerry D. Craig
*Attorney*—Hill, Sherman, Meroni, Gross & Simpson

[57] ABSTRACT

Field effect transistor and method of making same, the transistor having a high resistance layer of one conductivity type, an epitaxially grown layer of the opposite conductivity type on the first layer, and a low resistance semiconductor layer formed between the two layers and extending partly into both layers, the low resistance layer being of the same conductivity type as the first-mentioned layer, with a channel between the low resistance layer and the second semiconductor layer.

8 Claims, 9 Drawing Figures

Inventor
Hajime Yagi by Hill, Sherman, Meroni, Gross & Simpson Attys.

Patented May 16, 1972 3,663,873

2 Sheets-Sheet 2

Inventor
Hajime Yagi by Hill, Sherman, Meroni, Gross & Simpson Attys.

FIELD EFFECT TRANSISTOR

This application is a continuation of application Ser. No. 580,752 filed Sept. 20, 1966, and now abandoned entitled FIELD EFFECT TRANSISTOR.

The present invention relates to the manufacture of field effect transistors and, more particularly, to a field effect transistor which has improved high frequency response characteristics.

A field effect transistor is a device which has an extremely high input impedance and behaves somewhat like a low voltage vacuum tube. A typical field effect transistor consists of a substrate of, for example, a material of one conductivity type having impurities of the other conductivity type introduced in spaced areas thereof, creating PN junctions and forming a channel between the spaced similar conductivity regions. Metallic contacts are secured to the electrodes which are identified as the source, gate, and drain electrodes. The field effect semiconductor functions by modulation of the conductance of the thin channel region of the semiconductor by transverse electric fields. The rectifying connection to the channel region which produces the transverse electric field is known as the gate. Current flows between a source connection at one end of the channel and a drain connection at the other end of the channel, and this current may be modulated by varying the bias of the gate connection. Devices of this type can be operated as transistors having high input and output impedances. If the gate is self-biased, the device may be operated as a current limiter.

One of the difficulties arising from previously suggested field effect transistors arises from the high input and output capacitances which limit their usefulness at high frequencies. In order to reduce the capacitance of the pn junction in, for example, an N-channel field effect silicon transistor, the concentration of a P-type region of the pn junction is made small. However, this results in marked deterioration of the performance of the transistor and imposes a severe limitation on the construction of this type of device. With the techniques used in the prior art, it has been considered impossible to produce a field effect transistor which is highly efficient and which still has excellent high frequency characteristics.

One of the objects of the present invention is to provide an improved field effect transistor which has improved response, i.e., has relatively low capacitance at high frequencies.

Another object of the invention is to provide a field effect transistor having improved response characteristics and in which the areas of differing resistivity and conductivity types can be accurately aligned.

A further object of the invention is to provide a method for the manufacture of a field effect transistor which is easier to carry out than comparable methods used in the past.

Another object of the invention is to provide an improved method for the manufacture of a field effect transistor which produces transistors having uniform characteristics.

Other objects, features, and advantages of the present invention will become apparent to those skilled in the art from the following description taken in conjunction with the accompanying drawings, in which.

AS SHOWN IN THE DRAWINGS

Figure 1:
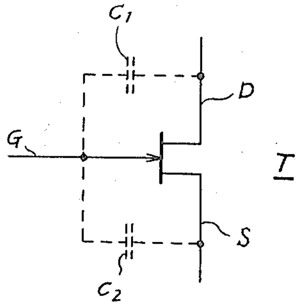
FIG. 1 is a schematic circuit diagram illustrating certain properties of a field effect transistor.

In FIG. 1, there is illustrated an equivalent circuit diagram for a field effect transistor T. The field effect transistor comprises a gate electrode G, a source electrode S, and a drain electrode D. In operation of the device, the width of the space charge region is varied with the bias applied to the gate electrode G, thereby controlling the current flowing between the gate electrode G and the drain electrode D. Reference character $C_1$ represents the capacitance present between the drain electrode D and the gate electrode G, while reference character $C_2$ represents the capacitance appearing between the gate electrode G and the source electrode S. In the design presently used for field effect transistors, the values of the capacitances $C_1$ and $C_2$ are relatively high so that they cannot effectively be used at high frequencies.

Figure 2:
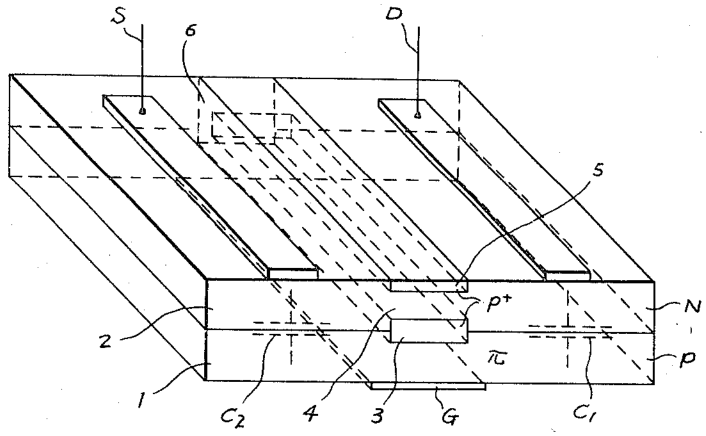
FIG. 2 is a view in perspective on a greatly enlarged scale illustrating an N-channel field effect silicon transistor produced according to the present invention.
Figure 3A:
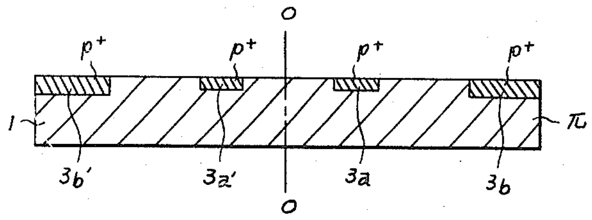
FIG. 3A through FIG. 3F illustrates in sequence the steps employed in the manufacture of a field effect transistor in accordance with the present invention.
Figure 3B:
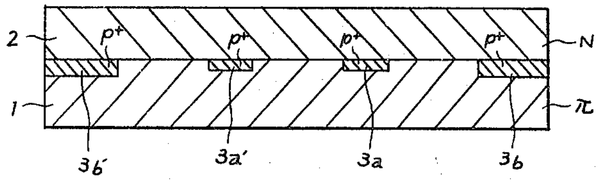
Figure 3C:
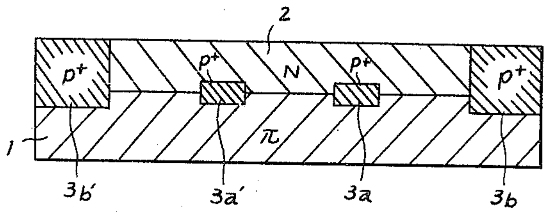
Figure 3D:
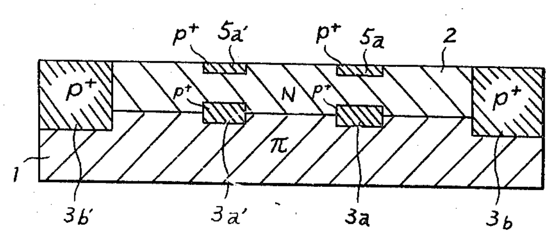
Figure 3E:
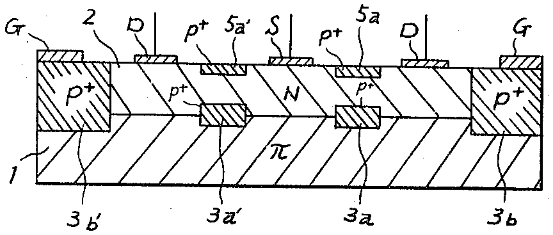
Figure 3F:
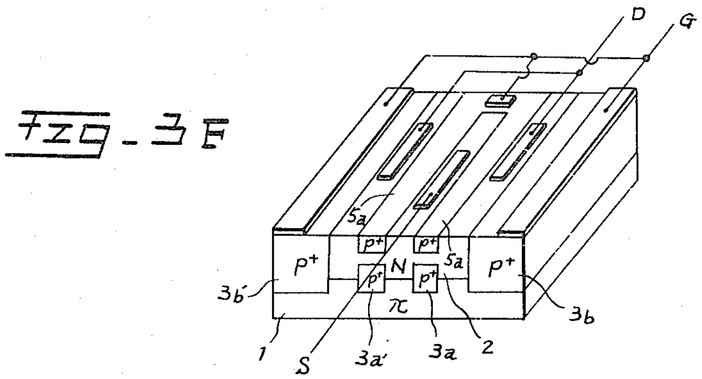

The field effect transistor of the present invention, of the type shown in FIGS. 2 and 3F, can be used at high frequencies in the range from about 100 megacycles to 500 megacycles while still retaining the same mutual conductance, gm, as obtainable with other types of field effect transistors.

In the specific embodiment illustrated in FIG. 2, the reference numeral 1 indicates a P-type conductivity silicon layer of high resistance, referred to as a Pi-type conductivity layer, while reference numeral 2 identifies an N-type epitaxial silicon layer having a conductivity type opposite to that of the silicon layer 1 and being grown on the former by an epitaxial growth step. Between the layers 1 and 2 there is formed a P+ type low resistance silicon layer 3 of the same conductivity type as the P-type high resistance silicon layer 1, the layer 3 being so disposed as to extend partly into both layers 1 and 2. A channel 4 is thereby provided in the region of the N-type epitaxial silicon layer 2 which overlies the silicon layer 3. Reference character G indicates a gate electrode attached to the high resistance silicon layer 1, S is a source electrode attached to the silicon layer 2, and D is a drain electrode attached to the silicon layer 2. Between the source and drain electrodes S and D is a P+ type layer 5 of the same conductivity as the aforementioned low resistance silicon layer 3, the P+ layer 5 being continuous and connected to the layer 3 at a portion indicated at reference numeral 6 in the drawings. While the preferred embodiment of the invention involves the inclusion of such a layer 5 in addition to the layer 3, in some cases a P+ type layer 5 may be omitted.

In this type of field effect transistor, a channel 4 exists in the region of the N-type epitaxial silicon layer 2 which is defined by the P+ type low resistance silicon layers 3 and 5. In the absence of the layer 5, a channel is formed in that region of the N-type expitaxial layer 2 which overlies the low resistance silicon layer 3. This provides a high degree of concentration of the P+ type silicon layer 3 in the pn junction between the layers 2 and 3 which results in an increased utilization rate of space charge of the channel upon applying a signal to the gate, thereby providing improved performance for the transistor. Particularly improved results are obtained when the channel 4 is formed between opposed P+ type low resistance silicon layers 3 and 5.

Since the low resistance silicon layer 3 is formed between the high resistance silicon layer 1, and the epitaxial silicon layer 2 in such a way as to extend partly into both layers for a very short depth, the capacitances $C_1$ and $C_2$, illustrated diagrammatically in FIG. 2, extend over a substantial portion of the junction formed by the layers 1 and 2, except for the portion extending along the channel 4. These capacitances $C_1$ and $C_2$ are formed in the pn junction defined by low concentration layers, so that the values of the capacitances $C_1$ and $C_2$ are relatively low. Consequently, in the field effect transistor of the present invention, the capacitance $C_1$ between the gate G and the drain D and the capacitance $C_2$ between the gate G and the source S are both small so that the high frequency characteristics are correspondingly improved. Furthermore, since the low resistance silicon layer 3, formed in a very small portion of the layers 1 and 2, is of a high concentration, the utilization rate of the space charge layer of the channel overlying the layer 3 is increased, thereby providing improved performance for the transistor.

Referring next to FIG. 3, there will be described a sequence of steps which can be used in the manufacture of field effect transistors of the type with which the present invention is concerned.

As seen in FIG. 3A, there is provided a high resistance semiconductor such as a Pi-type silicon wafer 1 having a resistivity on the order of 20 ohm-centimeters. An impurity of the same conductivity type as the substrate 1 is then deposited on the surface of the substrate 1. For example, boron can be selectively diffused into the substrate 1 at a high concentration in an oxygen atmosphere while maintaining the substrate 1 at a temperature of about 1,150° C. for 30 minutes. This results in the formation of P+ type low resistance silicon layers *3a*, *3a'*, *3b*, *3b'* of the same conductivity type as the Pi-type substrate 1. In the example shown, the P+ type low resistance silicon layers *3a*, *3b* and *3a'*, *3b'* are located in stripes symmetrically arranged with respect to the centerline 0—0 of the substrate 1. Other arrangements, of course, are possible including the type shown in FIG. 2 of the drawings. The silicon layers *3b* and *3b'* are contiguous to each other at the rear ends thereof, as are the layers *3a* and *3a'*. The two pairs of layers *3b*, *3b'* and *3a*, *3a'* are interconnected at their contiguous portions. After etching away the silicon dioxide layer from the surface of the substrate 1, and N-type silicon layer 2 of the conductivity type opposite that of the high resistance silicon substrate 1 is grown to the thickness of about 5 microns on the surface of the substrate 1 by a epitaxial growth process, as illustrated in FIG. 3B. Epitaxial growth processes are well known in the art and provide an extension of the original crystalline structure of the substrate, with the atoms of the epitaxial layer being aligned as a continuation of the original crystalline structure. In a typical epitaxial growth process, the substrate is heated in a reaction chamber, and a gas stream of hydrogen saturated with vapors of a silicon halide such as silicon tetrachloride doped with a small amount of phosphorous trichloride is passed over the heated substrate in the chamber. A reaction takes place at the surfaces, and a film or layer of silicon grows in monocrystalline form on the surface of the substrate. The impurity material also deposits in elemental form along with the silicon on the substrate.

Following the epitaxial growth of the N-type silicon layer 2, the substrate 1 is heated at a temperature of about 1,100° C. in an oxygen atmosphere for about 30 minutes, thereby effecting controlled diffusion of the P+ type regions. By this technique, the P+ type low resistance silicon layers *3a*, *3a'*, and *3b* and *3b'* diffuse and extend up into the epitaxial layer 2. Following this, an impurity such as boron is diffused into the epitaxial layer 2 from the surface thereof in those areas which overlie the low resistance silicon layers *3b* and *3b'* so that the low resistance silicon layers *30b* and *3b'* may reach the upper surface of the N-type epitaxial layer 2, as shown in FIG. 2C. Then, the boron impurity is selectively diffused into the epitaxial layer 2 at selected locations overlying the low resistance silicon layers *3a* and *3a'*, forming P+ type low resistance silicon layers *5a* and *5a'* illustrated in FIG. 3D. The location of the low resistance silicon layers *3a* and *3a'* can be detected as an irregularity of the epitaxial layer surface, so that the P+ type low resistance silicon layers *5a* and *5a'* can readily and precisely be formed in the epitaxial layer 2 at such locations as to overlie the low resistance silicon layers *3a* and *3a'*. In this manner, channels are formed between the low resistance silicon layers *3a*, *3a'* *3b*, *3b'*, *5a* and *5a'* which are used as gates. Subsequent to the information of the aforementioned silicon layers, electrodes can be attached to the devices as illustrated in FIG. 3E, reference character G indicating a gate electrode, S — a source electrode, and D — a drain electrode. The completed transistor is shown in perspective in FIG. 3F.

Measurements taken on the field effect transistor produced according to the present invention have determined that the capacitance of the PN junction is approximately one-half of the obtainable with a conventional field effect transistor, It has also been found that the mutual conductance, gm, is substantially is the same as that of conventional field effect transistors, and that the high frequency characteristics are superior to those of the conventional transistors.

Figure 4:
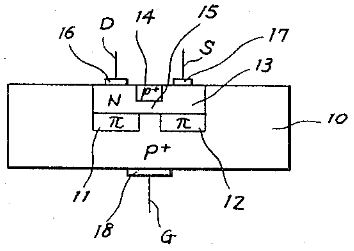
FIG. 4 is an enlarged cross-sectional view illustrating a modified form of a field effect transistor which can be employed in accordance with this invention.

FIG. 4 of the drawings illustrates a modified form of the invention. This form of the invention includes a substrate 10 of P+ type low resistance silicon. A pair of strips 11 and 12 are of Pi-type high resistance silicon of P conductivity type are formed in the substrate 10. An N-type conductivity layer 13 overlies the two strips 11 and 12, and a P+ type low resistance silicon layer 14 is selectively diffused into the N-type layer 13. A channel 15 is thereby provided in the N-type region between the two areas of P+ type low resistance silicon. Electrodes, including a drain electrode 16 and a source electrode 17, are secured to the N-type conductivity strip 13, while a gate electrode 18 is secured to the P+ type substrate 10. With this arrangement, the capacitance of the PN junction can be made even smaller, so that the transistors can be used at higher frequencies. However, the junction resistance of the gate is somewhat higher in this form.

From the foregoing, it will be understood that the field effect transistors of the present invention are particularly useful for use at high frequencies because of their low inherent capacitances. It should also be evident that many modifications and variations can be made to the described embodiments without departing from the scope of the novel concepts of the present invention.

I claim as my invention:

1. A field effect transistor comprising:
a first layer of semiconductor material including first and second surfaces, said first layer having a high resistivity and being of a first conductivity type;
a second layer of semiconductor material carried on said first layer including first, second, third and fourth surfaces, said second surface forming a junction with the first surface of said first layer, said second layer being of an opposite conductivity type to said first layer and having a lower resistivity than said first layer;
a plurality of parallel spaced-apart elongate first strips of semiconductor material disposed in both of said first and second layers, said strips being of said first conductivity type and of a resistivity lower than said second layer;
a plurality of parallel spaced-apart elongate second strips of semiconductor material disposed in said second layer opposite respective ones of said first strips, said second strips being of said first conductivity type and of the same resistivity as said first strips;
a plurality of parallel spaced-apart third elongate strips of semiconductor material disposed parallel to said first and second strips and each extending below the first surface of said first layer and against said third and fourth surfaces of said second layer, respectively, said third strips being of said first conductivity type and of the same resistivity as said first strips;
said second layer carrying a first electrode on its first surface between said second strips;
said second and third strips carrying respective second electrodes thereon;
said first, second and third strips forming a plurality of channels therebetween in said second layer;
said second strips and said first strips being of equal width;
first means electrically connecting said first strips together at one end of each of said strips;
second means electrically connecting said second strips together; and
third means electrically connecting said third strips together.

2. A semiconductor field effect device comprising:
a. a first layer of semiconductor material of one conductivity type;
b. a second layer of semiconductor material of opposite conductivity type contiguous to said first layer and defining a PN junction therebetween, said second layer being of epitaxially grown material and having a lower resistivity than the portion of said first layer contiguous to said second layer;
c. a first diffused gate region of said one conductivity type extending along a portion of the plane of said PN junction;

d. a second diffused gate region of said one conductivity type formed in the surface of said second layer in opposed relationship to said first region and defining a channel therebetween;
e. first and second low resistance contacts to said second layer on opposite sides of said channel;
f. means for making low resistance electrical contact to said first and second regions including a low resistivity guard region of the one conductivity type bounding a portion of said second layer contacted by said first and second low resistance contacts and extending from the surface of said second layer to said PN junction and contacting said first region, and
g. said first and second regions being of lower resistivity than the portion of said first layer contiguous to said second layer and elongated in a direction normal to the channel whereby their length is much greater than their width;
h. the gate-input capacitance of the device being reduced by the portion of the first layer contiguous to the second layer and bounded by the guard region being of higher resistivity than said second layer and said first and second regions.

3. A semiconductor field effect device as defined in claim 2 wherein said first region extends into said guard region and wherein said guard region is of lower resistivity than said portion of said first layer contiguous to said second layer for providing low resistance contact to said first region.

4. A semiconductor field effect device as defined in claim 2 wherein said second layer is of higher resistivity than said first and second regions.

5. A semiconductor field effect device as defined in claim 2 further including a third region of one conductivity type extending along the plane of said PN junction in opposed relationship to said guard region and of the same configuration as said guard region and wherein said guard region extends into said third region.

6. A semiconductor field effect device as defined in claim 2 wherein said first region is formed partially in said first layer and partially in said second layer.

7. A semiconductor field effect device as defined in claim 2 wherein said first region is disposed internally of said device and does not extend to any surface.

8. A semiconductor field effect device comprising:
a. a first layer of semiconductor material of one conductivity type;
b. a second layer of semiconductor material of opposite conductivity type contiguous to said first layer and defining a PN junction therebetween, said second layer being of epitaxially grown material;
c. a first diffused gate region of said one conductivity type extending along a portion of the plane of said PN junction;
d. a second diffused gate region of said one conductivity type formed in the surface of said second layer in opposed relationship to said first region and defining a channel therebetween;
e. first and second low resistance contacts to said second layer on opposite sides of said channel;
f. a guard region of the one conductivity type bounding a portion of said second layer contacted by said first and second contacts and extending from the surface of said second layer to the PN junction between the first and second layer;
g. said first and second regions being elongated in a direction normal to the channel whereby their length is greater than their width and intersecting said guard region at opposite sides of said channel whereby said guard ring establishes the width of said channel and provides low resistance electrical contact to said first and second gate regions;
h. the portion of said first layer contiguous to said second layer having a higher resistance than said second layer and said first and second gate regions to reduce the gate-input capacitance of the device.

* * * * *